United States Patent
De Leeuw et al.

(10) Patent No.: US 6,855,949 B2
(45) Date of Patent: Feb. 15, 2005

(54) COMPOSITION, METHOD AND ELECTRONIC DEVICE

(75) Inventors: Dagobert Michel De Leeuw, Eindhoven (NL); Gerwin Hermanus Gelinck, Eindhoven (NL); Bart-Hendrik Huisman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/255,850

(22) Filed: Sep. 26, 2002

(65) Prior Publication Data

US 2003/0067005 A1 Apr. 10, 2003

(30) Foreign Application Priority Data

Oct. 1, 2001 (EP) ............................................. 01203720

(51) Int. Cl.⁷ .......................... H01L 35/24; H01L 51/00
(52) U.S. Cl. ........................................... 257/40; 257/72
(58) Field of Search .............................. 257/40, 58, 72, 257/289, 410, 613; 438/82, 99

(56) References Cited

U.S. PATENT DOCUMENTS

| | | | |
|---|---|---|---|
| 5,137,799 A | 8/1992 | Kaempf et al. | 430/270 |
| 5,500,537 A | 3/1996 | Tsumura et al. | 257/40 |
| 5,854,139 A | 12/1998 | Aratani et al. | 438/780 |
| 6,429,450 B1 * | 8/2002 | Mutsaers et al. | 257/40 |

FOREIGN PATENT DOCUMENTS

WO    WO0120691    9/2000    ........... H01L/51/30

OTHER PUBLICATIONS

Brown et al. Synth. Metals, 88 (1997), 37–55. "Field–effect transistors made from solution–processed organic semiconductors".

J. Kalinowski et al, "Thomson–Like Electon–Hole Recombination in Organic Light–Emitting Diodes", Japanese Journal of Applied Physics, Publicatin Office Japanese Journal of Applied Physics, Tokyo, JP, vol. 40, No. 38, Part 2, Mar. 15, 2001, pp. L282–L285, XP001078050.

* cited by examiner

*Primary Examiner*—Hoai Pham

(57) ABSTRACT

The electronic device includes a thin-film transistor (10) with an active layer (5) that comprises an organic semiconductor material and a carrier material that is free of charge camera. The carrier material has a conductivity below $10^{-6}$ S/cm and is preferably electrically insulating. The thin-film transistor (10) has a mobility that is comparable to that of a transistor with an active layer that consists of an organic semiconductor material. Preferably, the organic semiconductor material is an oligomer. The composition used to apply the active layer may contain a photosensitive component. Using such a composition, the active layer can be relief-structured, thereby preventing any leakage current between neighboring transistors in the electronic device.

4 Claims, 1 Drawing Sheet

COMPOSITION, METHOD AND ELECTRONIC DEVICE

Figure 1:
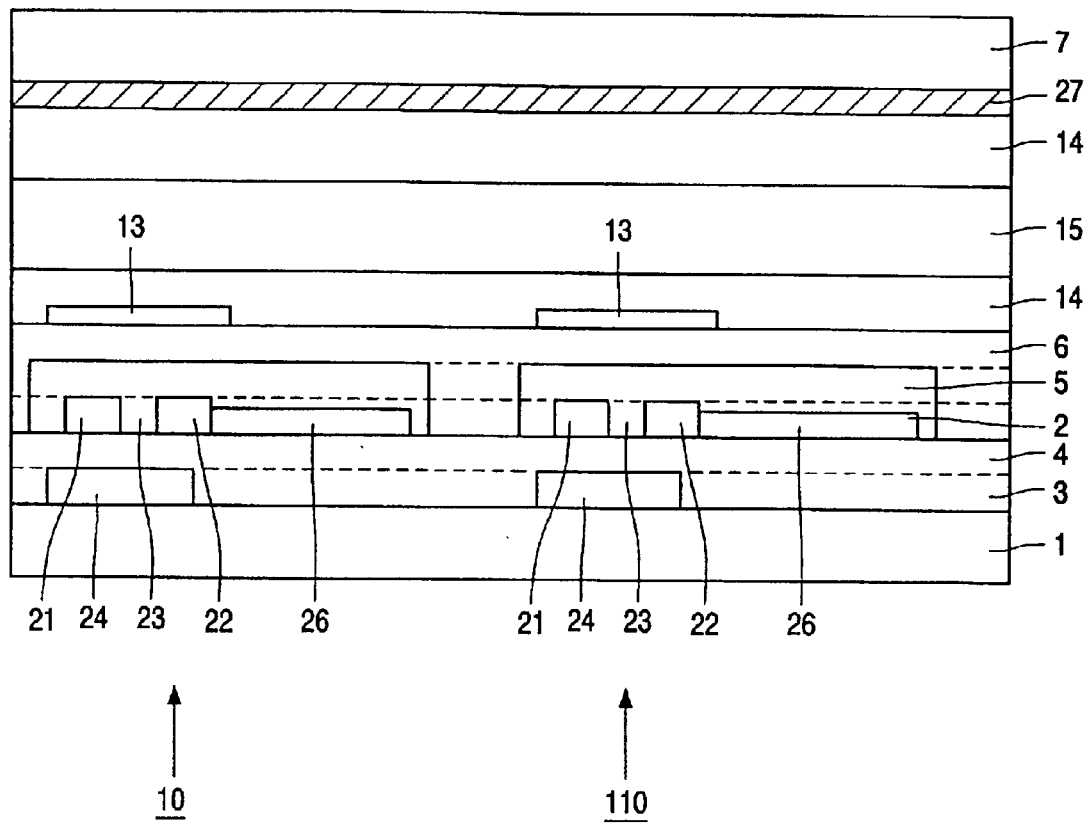

The invention relates to an electronic device equipped with a thin-film transistor comprising
a first electrode layer with a source electrode and a drain electrode,
an active layer comprising an organic semiconductor,
an intermediate layer comprising dielectric material, and
a second electrode layer comprising a gate electrode.
The invention also relates to compositions.

The invention further relates to a method of manufacturing an electronic device, comprising the application of a liquid composition onto a substrate in order to form an active layer comprising an organic semiconductor.

Such a device and such a method are known from WO-A-99/10939. The active layer of the thin-film transistor of the known device is applied from a solution. This solution contains a precursor of the organic semiconductor. The precursor, which comprises one or more additional side groups in comparison to the organic semiconductor, is converted to the organic semiconductor by heating. This takes place after the solution has been applied to a substrate.

A drawback of the known method resides in that the availability of a precursor is limited to only a number of organic semiconductors. In some semiconductors, the layer formed using the precursor is poor in quality, i.e. mobility is low.

Therefore, it is a first object of the invention to provide an electronic device of the type mentioned in the opening paragraph, the active layer of which can be applied from a solution and exhibits good film-forming properties.

Said first object is achieved in that the active layer of the thin-film transistor comprises an organic carrier material that is undoped and mixed with the organic semiconductor. By virtue of said carrier material, the solution of organic semiconductor and carrier material can be readily processed into an active layer. A condition imposed on the carrier material is that said carrier material must be free of charge carriers, since charge carriers create a leakage current through the active layer and hence very adversely affect the modulation of the thin-film transistor. The fact that the carrier material is undoped generally means that the conductivity is below $10^{-6}$ S/cm. It may happen of course that said carrier material becomes slightly doped unintentionally, for example, by reacting with oxygen from the air. Examples of such carrier materials are electrically insulating and semiconductive materials. Surprisingly it has been found that the active layer has a good mobility in spite of the reduced organic semiconductor content.

It is known from WO-A-91/21135 that a composition of an organic conductive material and a carrier material can be used to provide layers on a substrate. This composition is preferably used to manufacture fibers. If said composition is used to manufacture fibers, the composition is doped, after it has been applied, so as to obtain a higher conductivity. It is not known, however, that an active layer of a thin-film transistor can also be manufactured in this manner. Unlike the known composition, the active layer in accordance with the invention is not doped. The reason is that doping would lead to a higher leakage current between the source electrode and the drain electrode. Such a leakage current through the active layer adversely affects the functioning of the transistor.

Examples of organic semiconductors that can be used in the device in accordance with the invention are, inter alia, poly-3-alkylthiophenes, polythienylenevinylenes, polypyrroles, polyfuranylenevinylenes, polyarylamines, pentacene, oligothiophenes and polyfluorenes.

In an embodiment of the device in accordance with the invention, the organic semiconductor is an oligothiophene. Oligothiophenes generally exhibit a higher mobility than polymeric semiconductors, such as poly-3-alkylthiophene and polythienylenevinylene. This is the reason why the transistors of the inventive device manufactured at least largely from the solution operate at a higher speed. Favorable examples are, inter alia, oligothiophenes with 4 to 12 thiophene units and alkoxy or alkyl group-substituted oligothiophenes or halogen-substituted oligothiophenes, as known from the state of the art. A particularly favorable example is dihexyl-substituted sexithiophene.

U.S. Pat. No. 5,584,139 discloses a thin-film transistor whose active layer contains an oligothiophene. This semiconductor is provided by means of vacuum deposition. A drawback of the known device resides in that the active layer must be provided by means of vacuum deposition. One of the advantages of the thin-film transistors with an organic semiconductor over thin-film transistors with amorphous silicon is precisely that layers can be provided from the solution, for example by means of spincoating.

In a further embodiment of the device in accordance with the invention, the organic semiconductor is pentacene. As pentacene can be dissolved in nitrobenzene in very low concentrations only, a layer of pentacene is customarily applied from the vapor phase or from a solution of a precursor material in an organic solvent. Such a precursor material is known from, for example, Brown et al. *Synth. Metals*, 88(1997), 37–55. If the solution is applied to a substrate by means of spincoating, however, a layer that completely covers the surface is not obtained. This applies in particular if the surface is larger than a few cm$^2$. It has been found that a layer that completely covers the surface is obtained by using a solution of the precursor material and polystyrene. This active layer can extend over the surface of a 150 mm (6 inch) wafer. The layer thus formed is amorphous in character. When the precursor material is converted to pentacene, crystallites of the pentacene form. It has been found that by mixing carrier material and pentacene, the degree of surface roughness of the layer formed is reduced. As a result, other layers can be applied to the active layer. For example, the transistor with the active layer containing pentacene is integrated in a display device with liquid crystalline material.

In yet another embodiment, the semiconductor is a poly-3-alkylthiophene. It is further preferred to employ a poly-3-alkylthiophene comprising an alkyl chain with an odd number of carbon atoms, and it is still further preferred to employ poly-3-pentylthiophene or poly-3-heptylthiophene. It has been found that the mobility of poly-3-pentylthiophene, which as yet is unknown per se, is twice the mobility of poly-3-hexylthiophene under otherwise identical conditions, namely $4.10^{-2}$ as compared to $2.10^{-2}$ cm$^2$/Vs.

An advantage of the device in accordance with the invention is that, other layers can be applied to the active layer. A particular example of such a layer is a protective layer. Due to the inhomogeneity of the known layer this was impossible until now. Such a protective layer provides a shield against incident radiation. It has been found that, in the presence of oxygen, the incidence of radiation leads to a comparatively large increase in conductivity of the semiconductor. This is unfavorable as it adversely affects the modulation of the transistor to a level at which the transistor no longer operates satisfactorily. By stopping the incidence of precisely this radiation, the service life of the electronic device in accordance with the invention can be extended. It has further been found that shielding is necessary, in particular, for that part of the active layer that is situated in the channel. In other parts of the active layer, the presence of oxygen when radiation is incident will also lead to the formation of charge carriers. However, this does not lead to a substantial reduction in modulation.

The organic carrier material may be an electrically insulating material as well as a semiconductive material. Examples of electrically insulating materials are polyvinyl compounds, such as polyethylene, polypropylene, polystyrene; polyimides, polyesters, such as polymethylmethacrylate, polyethyleneterephtalate, polyethyleneglycoldimethacrylate; polyvinylalcohols. The carrier materials preferably have a glass transition temperature in excess of 100° C., as a result of which the stability of the carrier material is ensured under a variety of production and operating conditions. Examples of semiconductive materials are polythienylenevinylenes, polyaniline, polypyrroles, polyfuranylenevinylenes.

In a favorable embodiment, the active layer is patterned in accordance with a desired pattern so as to obtain a relief structure. It is favorable to pattern the active layer in order to preclude leakage currents between thin-film transistors. This applies, in particular, if the device is a display device of the liquid-crystalline, active-matrix type (AMLCD) and the thin-film transistors are used to drive the pixels. The active layer can be patterned in a favorable manner by adding a photosensitive component to the active layer and subsequently exposing and developing said active layer. Examples of suitable carrier materials are, inter alia, acrylates, epoxy compounds, vinylethers and thiolene systems. Acrylates are particularly favorable carrier materials as they can be readily dissolved in solvents wherein also the semiconductor can be dissolved. Alternatively, a commercially available photoresist material can be used as the electrically insulating carrier material. By exposing and developing in known manner, this photoresist material can be patterned in the desirable way.

In a further embodiment of the device in accordance with the invention, the carrier material is a network whose molecular orientation is fixed by cross-linking. The active layer is ordered by said orientation. This is to be taken to mean that this ordering causes the chains of the organic semiconductor molecules to be linearized, and that the spacing between two chains is reduced. By virtue thereof, the mobility of the semiconductor is enhanced.

Such a network is generally formed by orienting liquid crystalline monomers and subsequently polymerizing them under the influence of light. For the orientation use can be made of, inter alia, an additional orientation layer and of an electric or magnetic field to be applied. Alternatively, the monomer is heated to a temperature above the nematic-to-isotropic transition temperature, i.e. approximately 100° C., and is subsequently cooled again. This applies in particular to networks whose coefficients of expansion can be influenced in a number of desired directions.

Examples of suitable monomers are, inter alia, acrylates, epoxy compounds, vinylethers and thiolene systems. Particularly acrylates are favorable because they can be polymerized in a non-ionic manner, i.e. by means of photoinitiators. Examples of such acrylates are described in EP-A 261712. Such acrylates can be dissolved in organic solvents such as THF, ethers such as diethyleneglycoldimethylether and dichloromethane wherein organic semiconductors can also be readily dissolved.

The device may for instance be a transistor, or include a transistor. Particularly preferred are identification tags comprising integrated circuits and flexible displays.

A method of the type mentioned in the opening paragraph is known from U.S. Pat. No. 5,584,139. In a first embodiment, parts of the active layer are removed by exposure to laser light radiation having a wavelength of 195 nm. A drawback thereof resides in that ultraviolet radiation also attacks other layers in the device. A further drawback is that the semiconductor itself can also be attacked. In addition, such radiation is extremely expensive to work with. In a second embodiment of the known method, the semiconductor is converted into electrically insulating polymer by exposure to radiation from a 100 W mercury lamp. A drawback thereof resides in that the electrically insulating polymer is insufficiently insulating to prevent that neighboring transistors are influenced.

Therefore a second object of the invention is to provide a method of the type mentioned in the opening paragraph, by means of which the active layer can be patterned into a relief structure without the risk that the transistor characteristics are adversely affected.

The second object is achieved in a method of manufacturing an electronic device, comprising the application of a liquid composition to a substrate in order to form an active layer comprising an organic semiconductor, characterized in that the composition comprises an electrically insulating, organic carrier material, an organic semiconductor and a photosensitive component;

the active layer is exposed in accordance with the desired pattern or the negative thereof; and the active layer is brought into contact with a solvent wherein such parts of the layer dissolve that the desired pattern remains behind as the relief structure.

It has been found that the active layer can be patterned if a photosensitive component is present. It can be attributed to the presence of the carrier material that the parts of the active layer to be dissolved are actually dissolved in the solvent.

In a favorable embodiment, the composition is prepared by mixing the organic semiconductor and a photoresist. Such photoresists often are compositions based on polyimide, polyvinylalcohol, polyvinylphenol, polyisoprene, polyacrylate, polyvinylpyrrolidone, p-hydroxystyrene polymer, polyepoxy resins, polyglutarimides, and are commercially available in a number of variants.

In a further embodiment of the method in accordance with the invention, the device is subjected to an aftertreatment by heating (annealing) it in a hydrogen or deuterium-containing atmosphere, for example at approximately 60° C. for 1 hour. By virtue of said aftertreatment, a good modulation is obtained.

The invention also relates to compositions that can be used in the methods in accordance with the invention and that can be used to manufacture the device in accordance with the invention.

To this end, the first composition in accordance with the invention comprises electrically insulating, organic carrier material and an oligothiophene. And the second composition in accordance with the invention comprises an electrically insulating, organic carrier material, an organic semiconductor and a photosensitive component.

The invention further relates to a method of the type mentioned in the opening paragraph, characterized in that the first composition in accordance with the invention is applied to the substrate.

Figure 2:
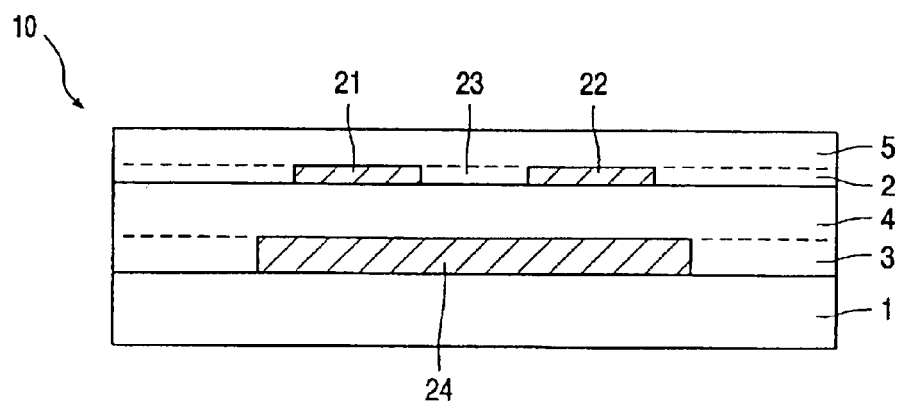

These and other aspects of the invention, the methods and the compositions in accordance with the invention will be elucidated with reference to Figures and exemplary embodiments, wherein:

FIG. 1 is a diagrammatic cross-sectional view of a first embodiment of the device; and FIG. 2 is a diagrammatic cross-sectional view of a second embodiment of the device.

Exemplary Embodiment 1

The thin-film transistor 10 shown in FIG. 1 comprises an electrically insulating substrate 1 with a first electrode layer 2 thereon. In this layer 2, a source electrode 21 and a drain electrode 22 are defined, which electrodes 21, 22 are separated from each other by a channel 23. A second electrode layer 3 wherein a gate electrode 24 is defined is also present on the substrate 1. If the gate electrode 24 is perpendicularly projected on the first electrode layer 2, then the gate electrode 24 substantially overlaps the channel 23. In addition, an intermediate layer 4 and an active layer 5 are present.

Said layers 2, 3, 4, 5 are present on the substrate 1 in the following sequence: second electrode layer 3, intermediate layer 4, first electrode layer 2 and active layer 5. To planarize the substrate, an isolating planarization layer of polyvinylalcohol, not shown, is present. The second electrode layer 3 contains Au and is appropriately patterned, in known manner, by means of an exposed and developed photosensitive resist. Between the second electrode layer 3 and the intermediate layer 4, a monolayer, not shown, of $CH_3-(CH_2)_{15}-SH$ is provided in order to preclude pinholes in the intermediate layer 4. The intermediate layer 4 comprises a photostructurable organic dielectric, such as benzocyclobutene, polyimide, polyvinylphenol or a photoresist, in this case the photoresist HPR504. The first electrode layer 2 comprises, in this case, poly(3,4-ethylenedioxythiophene) and a polystyrene sulfonic acid. The first electrode layer 2 is provided by means of spin-coating and structured by exposure.

The active layer 5 is spincoated onto the first electrode layer 2 in a thickness of 50 nm. The active layer 5 comprises polymethylmethacrylate as the electrically insulating, organic carrier material, and a pentathiophene having the geneva name 4'-butyl-[2,2';5',2'';5'',22''';5''',2'''] quinquethiophene as the organic semiconductor. The weight ratio between the carrier material and the semiconductor is 1. At least a part of the semiconductor layer 5 is present in the channel 23.

The experiment was repeated using different semiconductors and a different semiconductor concentration. The experiments are listed in Table 1. The transistor thus manufactured is characterized by measuring the mobility at a gate voltage $V_g=-20$ V; the results are listed in Table 2.

| no. | carrier material (a) | semi-conductor (b) | solvent | weight ratio (b/(a + b)) | no. | mobility $(cm^2/Vs)$ |
|---|---|---|---|---|---|---|
| 1 | PMMA | T5C4 | $CH_2Cl_2$ | 0.25 | 1 | $2, 7.10^{-4}$ |
| 2 | PMMA | T5C4 | $CH_2Cl_2$ | 0.32 | 2 | $6, 0.10^{-6}$ |
| 3 | PMMA | T5C4 | $CH_2Cl_2$ | 0.5 | 3 | $1, 1.10^{-3}$ |
| 4 | PMMA | T5C4 | $CH_2Cl_2$ | 0.8 | 4 | $1, 7.10^{-3}$ |
| 5 | — | T5C4 | $CH_2Cl_2$ | 1.0 | 5 | $1, 9.10^{-3}$ |
| 6 | polystyrene | sulphoxy-PTV | $CHCl_3$ | 0.67 | 6 | $4, 0.10^{-3}$ |
| 7 | polystyrene | sulphoxy-PTV | PVDF | 0.67 | 7 | $1, 4.10^{-3}$ |
| 8 | polystyrene | precursor pentacene | $CH_2Cl_2$ | 0.99 | 8* | 0.05 |
| 9 | polystyrene | precursor pentacene | $CH_2Cl_2$ | 0.50 | 9* | 0.005 |

*= measurement after conversion of pentacene precursor to pentacene at 200 °C. for 10 seconds.

PVDF=polyvinyldifluoride
T5C4=4'-butyl-[2,2';5',2'';5'',2''';5''',2'''']quinquethiophene The modulation was examined for example 3 from the Table. The modulation was measured by comparing the current at $V_g=0$ (V) and $V_g=-20$ (V) at a constant drain voltage $V_d=-20$ (V). Without aftertreatment, the modulation was 26. An aftertreatment of 1 hour at 60° C. in pure hydrogen resulted in a modulation of 154. An aftertreatment of 1 hour at 60° C. and subsequently 1 hour at 80° C. in pure hydrogen resulted in a modulation of 896. It was found that the mobility was not significantly changed by these aftertreatments.

Exemplary Embodiment 2

FIG. 2 shows a second embodiment of the device. The device comprises a first and a second thin-film transistor 10, 110. On a substrate 1 of polyimide, a second electrode layer 3 of Au is provided in accordance with a desired pattern. Said pattern comprises gate electrodes 24. The second electrode layer 3 is covered with an intermediate layer 4 which, in this example, is planarized. In this example, an intermediate layer 4 of polyvinylphenol is used that is crosslinked with hexamethoxymethylmelamine (HMMM) that is optically transparent. The first electrode layer 2 with source electrodes 21 and drain electrodes 22, that are separated from each other by a channel 23, is present on the intermediate layer 4. The drain electrodes 22 contact the picture electrodes 26. The active layer 5 is provided on the first electrode layer 2 so as to complete the thin-film transistors 10, 110. The active layer 5 comprises pentacene as the semiconductor and polyethyleneglycolmethylethermethacrylate as the carrier material. Said methacrylate is marketed by Aldrich and has a molecular weight of 330 g/mol. The active layer 5 is formed by providing a composition of a pentacene precursor, the carrier material and an Irgacure photoinitiator in diethyleneglycoldimethylether. The layer is structured in accordance with the desired pattern by exposure to radiation of 360 nm. In this process, the negative of the desired pattern is exposed. Subsequently, the pattern is developed in toluene. Next, conversion of the pentacene precursor to pentacene takes place. The active layer 5 is covered with an insulating layer 6 and, at the location of the transistors 10, 110, with a protective black layer 13. The contacts and electrodes 21, 22, 26 are obtained, for example, by first providing a double layer of indium tin oxide and subsequently selectively etching the metal of this layer, as a result of which the double layer remains intact at the location of these contacts and electrodes 21, 22, 26. Apart from the picture electrodes 26, the exposed indium tin oxide is completely etched away. The device further comprises a second substrate 7, which is provided with a counterelectrode 27 and, in addition, with orientation layers 14 and a liquid crystalline material 15 which are provided in a generally known manner, said liquid crystalline material being polymerized if necessary.

Exemplary Embodiment 3

A composition is applied to a substrate provided with a second electrode layer with a gate electrode, an intermediate layer comprising dielectric material and a first electrode layer with a source electrode and a drain electrode. The composition contains a 1% solution of polytriarylamine and polyacrylate in toluene. A quantity of 4.6 mg of a diazonium compound as the azide 4,4'-diazidobenzalactone-2,2'-disulphonic acid disodium salt is added to 3 grams of this composition. Exposure takes place by means of a broadband lamp, i.e. a High Pressure Mercury Lamp, emitting radiation in the range from 250 to 360 nm. After exposure of the desired pattern, the unexposed part is removed in toluene. The result is a transistor having a modulation of 500 and a mobility of $2,0.10^{-5}$ $cm^2/Vs$.

What is claimed is:

1. An electronic device equipped with a thin-film transistor (10) comprising a first electrode layer (2) with a source electrode (21) and a drain electrode (22), an active layer (5) comprising an organic semiconductor, an intermediate layer (4) comprising dielectric material, and a second electrode layer (3) comprising a gate electrode (24), characterized in that the active layer (5) comprises an organic carrier material that is free of charge carrier and mixed with the organic semiconductor.

2. An electronic device as claimed in claim 1, characterized in that the active layer (5) is patterned in accordance with a desired pattern so as to form a relief structure.

3. An electronic device as claimed in claim 1, characterized in that the organic semiconductor is an oligothiophene.

4. An electronic device as claimed in claim 1, characterized in that the organic semiconductor is pentacene.

* * * * *